United States Patent [19]

Neel et al.

[11] Patent Number: 5,157,337

[45] Date of Patent: Oct. 20, 1992

[54] DIELECTRIC CONSTANT MEASUREMENT PROBE ASSEMBLY AND APPARATUS AND METHOD

[75] Inventors: Michael M. Neel; Frank J. Schiavone, both of Ridgecrest, Calif.

[73] Assignee: The United States of America as represented by the Secretary of the Navy, Washington, D.C.

[21] Appl. No.: 593,727

[22] Filed: Oct. 3, 1990

[51] Int. Cl.⁵ .......................................... G01R 27/26
[52] U.S. Cl. .................................... 324/632; 324/633; 324/675; 324/687
[58] Field of Search ............... 324/632, 633, 634, 635, 324/668, 675, 682, 687

[56] References Cited

U.S. PATENT DOCUMENTS

| | | | |
|---|---|---|---|
| 2,439,527 | 4/1948 | Paulson | 324/633 X |
| 2,527,979 | 10/1950 | Woodward, Jr. | 324/632 X |
| 2,849,691 | 8/1958 | De Tar | 324/633 X |
| 3,400,331 | 9/1968 | Harris | 324/687 X |
| 3,778,706 | 12/1973 | Thompson | 324/668 |

*Primary Examiner*—Jack B. Harvey
*Assistant Examiner*—Glenn W. Brown
*Attorney, Agent, or Firm*—Harvey A. Gilbert; Melvin J. Sliwka; John L. Forrest, Jr.

[57] ABSTRACT

A dielectric constant measurement probe assembly includes a coaxial cable having a outer electrical conductor and a center electrical conductor extending within the outer conductor and terminating at an end portion which projects beyond an end portion of the outer conductor. An adapter member has a central passage receiving the coaxial cable with the outer conductor of the cable extending through the passage of the adapter member and projecting therefrom. An outer tube has a bore composed of first and second axial sections. The second bore section is smaller in diameter than the first bore section. The adapter member is inserted in the first bore section with the end portion of the coaxial cable outer conductor inserted into the second bore section and making electrical contact therewith such that the outer tube thus constitutes an extension of the outer conductor. A resonant rod is coupled with the end portion of the center conductor of the coaxial cable and an annular sleeve supports the resonant rod in the second bore section of the outer tube such that the rod constitutes an extension of the center conductor. The resonant rod and outer tube together define an open end of the coaxial cable such that the rod being capable of acting as a resonant structure upon energizing the coaxial cable produces fringing fields that protrude from the open end and penetrate a test sample disposed adjacent thereto.

18 Claims, 4 Drawing Sheets

DIELECTRIC CONSTANT MEASUREMENT PROBE ASSEMBLY AND APPARATUS AND METHOD

BACKGROUND OF THE INVENTION

1. Field of the Invention

The present invention generally relates to dielectric measurements on thin materials and, more particularly, to a probe assembly and an apparatus and method for making measurements of the dielectric constant of microwave circuit board or substrate materials over very small areas.

2. Description of the Prior Art

Using the simplest definition, the relative permittivity, $\epsilon_r$, of a material can be derived from the alignment of dipoles between charges in a dielectric medium. More specifically, if an electric field is applied to a dielectric material, an atomically small displacement of positive and negative charges, or polarization, occurs within each dipole. Each dipole has, in effect, produced a field that reduces the total electric field strength in the system. The effective magnitude of the electric field contributed by each charge to the total electric field is reduced by a factor, $\epsilon_r^{-1}$. The relative permittivity (or dielectric constant), $\epsilon_r$, is a resulting characteristic of the physical structure of the medium in which the electric field exists.

Transmission line theory is directly affected by the dielectric properties of a medium. The techniques and technology used in making microwave circuits have presented the need to verify the dielectric constant in a material so that predictable and expected results occur from the fabricated circuit. Experimentally determining a material's dielectric constant has taken several different measurement approaches. Some examples are measurements using a resonant cavity, resonant transmission line sections etched on the substrate, resonant half-height waveguide sections, and free space transmission phase delay.

These methods give measurements of the dielectric constant which are averaged over areas of approximately one-half wavelength squared at the frequency of measurement. The main limitation of these methods is that they either require destructive testing, or the results are an average over a relatively large area. These methods have proved unusable for performing measurements on small areas of typical microstrip fabricating materials (the thickness ranging from 10 to 35 mil) at the frequencies of 2 to 18 GHz.

Consequently, there is a need for a different approach to measurement of the dielectric constant of thin flat sheets of microwave substrate materials.

SUMMARY OF THE INVENTION

The present invention provides a dielectric constant measurement probe assembly and apparatus and method designed to satisfy the aforementioned need. The measurement probe assembly and apparatus and method allow point-to-point measurements of the dielectric constant of flat sheets of microwave circuit board or substrate material. The measurement accuracy attainable is high enough to result in resolution of less than one percent.

The approach of the present invention is based on two important characteristics found when examining open ended coaxial cable. First, an open ended coaxial cable can rather easily be made into a resonator. Second, fringing fields protrude past the open end of a coaxial cable. The extent to which these fringing fields penetrate the adjacent surrounding material is directly related to the properties of the material, particularly to the complex dielectric constant of the material. The resonant frequency of one dielectric medium will be different from that of a different dielectric medium. Thus, by determining the resonant frequency of a sample, the corresponding dielectric constant can be calculated.

The main advantages of the present invention are that the area of measurement in the material is much smaller than in the case of prior art methods, being limited in size only by the capability to manufacture coaxial line of very small diameters. The method of the present invention also is substantially non-destructive, i.e., the only operation needed on the material is to remove metal cladding over the areas of interest.

Accordingly, the present invention is directed to a dielectric constant measurement probe assembly. The probe assembly comprises: (a) a coaxial cable having a hollow outer electrical conductor terminating at an end portion and a center electrical conductor extending within the outer conductor and terminating at an end portion which projects beyond the end portion of the outer conductor; (b) an adapter member having a central passage receiving the coaxial cable such that the outer conductor of the cable extends through the passage of the adapter member with the end portion of the outer conductor projecting from the adapter member; (c) an elongated outer tube of electrically conductive material having a bore composed of first and second axially-extending sections, the second bore section being of smaller diameter than the first bore section, the adapter member being inserted in the first bore section with the end portion of the coaxial cable outer conductor inserted into the second bore section and making electrical contact therewith such that the outer tube constitutes an electrically conductive extension of the outer conductor of the coaxial cable; (d) an electrically conductive rod electrically coupled with the end portion of the center conductor of the coaxial cable; and (e) an annular sleeve of nonconductive material supporting the conductive rod in the second bore section of the outer tube such that the rod constitutes an electrically conductive extension of the center conductor of said coaxial cable combining with the outer tube to define an open end of the coaxial cable, the rod being capable of acting as a resonant structure upon energizing the coaxial cable so as to produce fringing fields that protrude from the open end and penetrate a test sample disposed adjacent to the open end.

The present invention also includes a dielectric constant measurement apparatus which comprises: (a) a base for supporting a flat test sample of dielectric material; (b) an upright member attached to the base; (c) an arm supported in cantilevered fashion by the upright member above the base; (d) the measurement probe assembly mounted to an outer end of the arm in generally perpendicular relation to the base and a test sample thereon, the probe assembly defining an open end of a coaxial cable capable of producing fringing fields that protrude from the open end and penetrate the test sample disposed adjacent thereto, the probe assembly mounted for movement vertically toward and away from the base; and (e) means coupled between the arm and the probe assembly for biasing the probe assembly toward the base such that an open end of the coaxial cable of the probe assembly is covered completely by the test sample on the base.

The present invention further includes a dielectric constant measurement method which comprise the steps of: (a) supporting a flat test sample of dielectric material; and (b) supporting a measurement probe assembly in a generally perpendicular relation to the test sample such that an open end of a coaxial cable defined by the probe assembly is capable of producing fringing fields that protrude from the open end and penetrate the test sample disposed adjacent thereto while the open end is completely covered by the test sample. The measurement method also includes (c) moving the probe assembly toward and away from the test sample in order to remove and replace one test sample with another.

These and other features and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the following detailed description, reference will be made to the attached drawings in which.

DETAILED DESCRIPTION OF THE INVENTION

Figure 1:
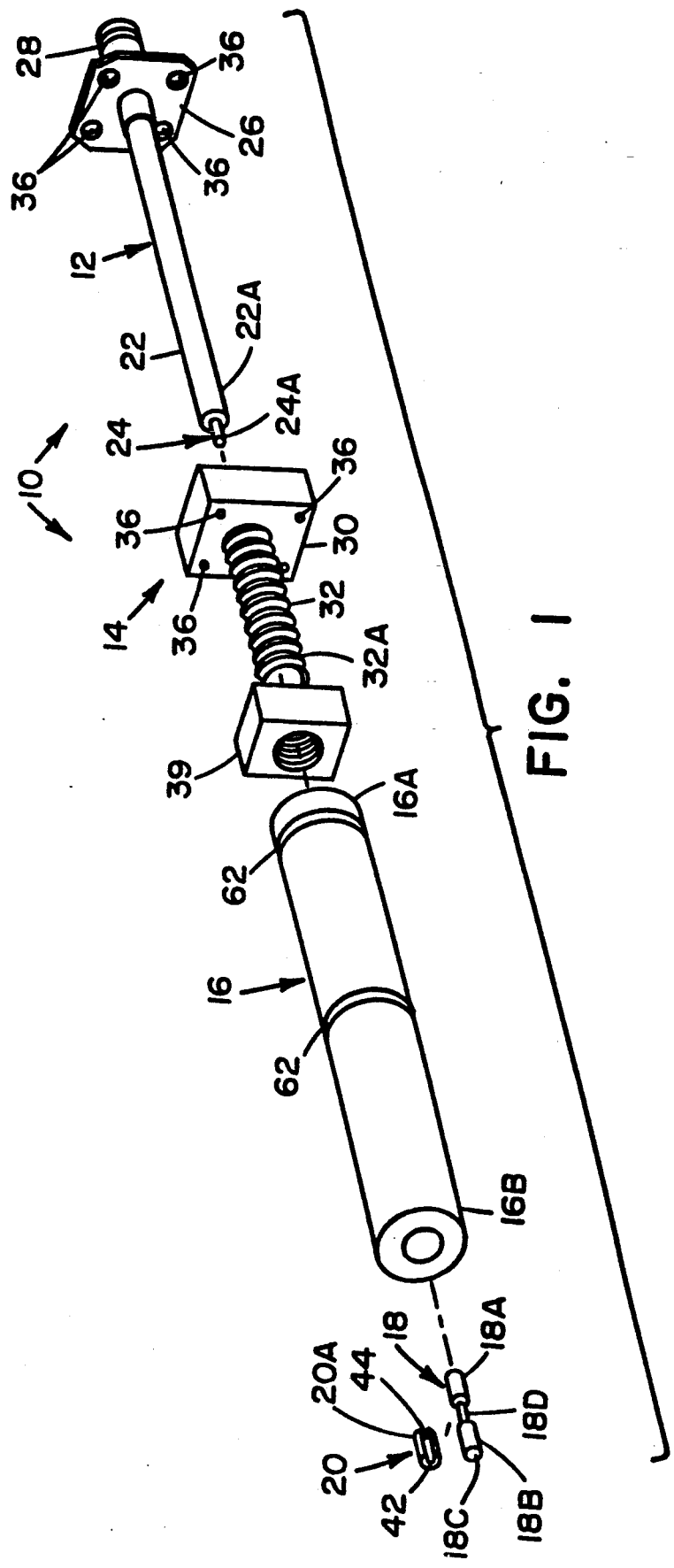
FIG. 1 is an exploded perspective view of the microwave dielectric measurement probe assembly in accordance with the present invention.
Figure 2:
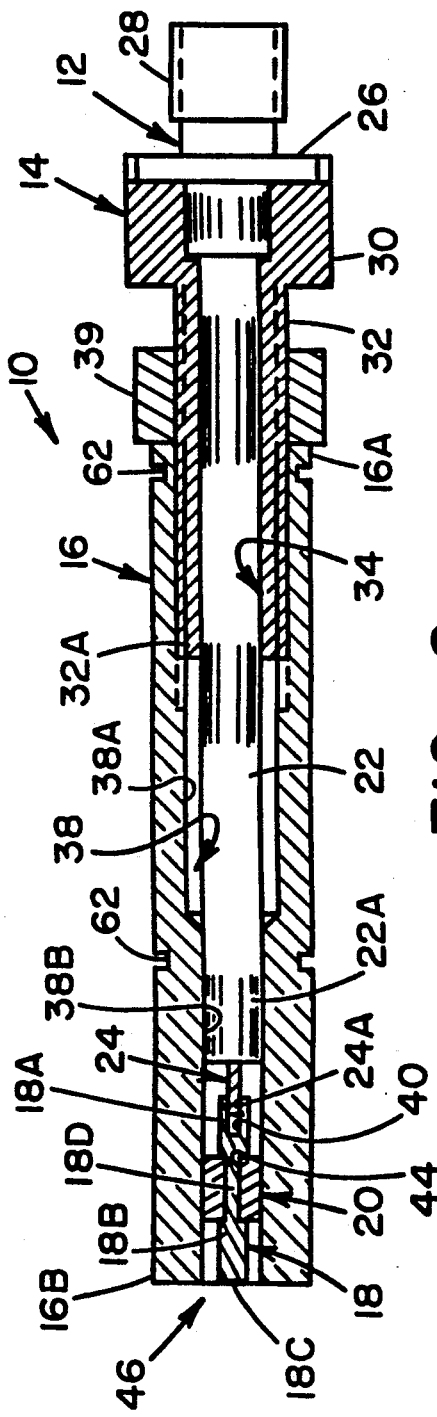
FIG. 2 is an enlarged axial sectional view of the measurement probe assembly of FIG. 1 with its components assembled together.
Figure 4:
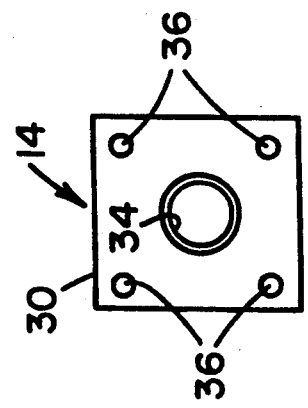
FIG. 4 is an end elevational view of the collet as seen along line 4—4 of FIG. 3.
Figure 3:
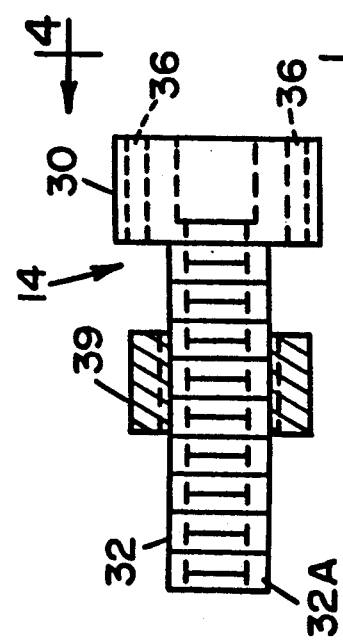
FIG. 3 is a side elevational view of a collet of the probe assembly of FIGS. 1 and 2.

Referring now to the drawings, and particularly to FIGS. 1 and 2, there is illustrated a dielectric constant measurement probe assembly 10 of the present invention. The probe assembly 10 basically includes a coaxial cable 12, an adapter member 14, an elongated outer shell or tube 16, a resonant rod 18, and an annular support sleeve 20.

More particularly, as seen in FIGS. 1 and 2, the coaxial cable 12 of the probe assembly 10 is semi-rigid and has an outer hollow electrical conductor 22 terminating at an end portion 22A and a center electrical conductor 24 extending coaxially within the outer conductor 22 and terminating at an end portion 24A which projects beyond the end portion 22A of the outer conductor 22. The coaxial cable 12 also includes a rectangular-shaped end mounting flange 26 having the outer conductor 22 attached to and extending from one side of the flange 26 and the center conductor 24 extending from the same one side of flange 26 as the outer conductor 22.

Further, a connector jack 28 is attached to and projects from the opposite side of the mounting flange 26. The jack 28 is electrically connected through the flange 26 to the outer and inner conductors 22, 24. The jack 28 is used to connect the probe assembly 10 to signal processing equipment, specifically such as a network analyzer and a computer, which will receive the signals and perform the necessary operations under the control and command, for instance, of an appropriate computer program, to arrive at the dielectric constant. Further description of such equipment is not necessary for gaining an understanding of the present invention.

Referring to FIGS. 1-4, the adapter member 14 of the probe assembly 10 is composed of a suitable electrically conductive metal, such as brass, and has an enlarged rectangular head portion 30 and an elongated stem portion 32 attached to and extending in one direction from the head portion 30. The head and stem portions 30, 32 define a central passage 34 extending therethrough and receiving the coaxial cable 12. Specifically, the outer conductor 22 of the cable 12 extends through the central passage 34 (shown in FIGS. 2 and 4) of the adapter member 14 in contact therewith. The end portion 22A of the outer conductor 22 projects from the terminal end 32A of the stem portion 32 of the adapter member 14. The mounting flange 26 of the cable 12 engages the head portion 30 of the adapter member 14. The flange 26 and head portion 30 have respective sets of threaded holes 36 which align with one another for receipt of screws (not shown) to fasten them together to retain the cable 12 in a desired stationary position through the adapter member 14. The stem portion 32 of the adapter member 14 is externally threaded for threadably inserting the adapter member 14 into the elongated outer tube 16.

Figure 5:
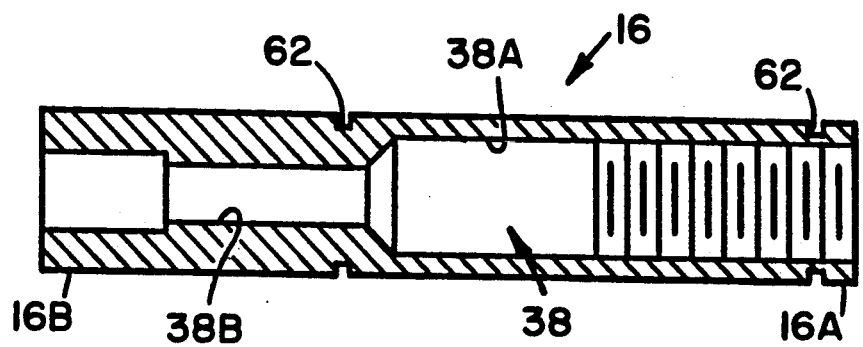
FIG. 5 is an axial sectional view of an outer shell of the probe assembly of FIGS. 1 and 2.
Figure 6:
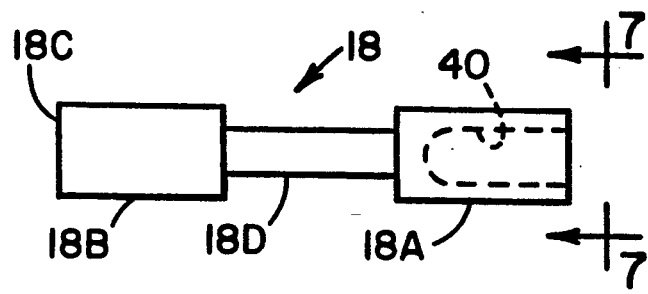
FIG. 6 is an enlarged side elevational view of a resonator of the probe assembly of FIGS. 1 and 2.
Figure 7:
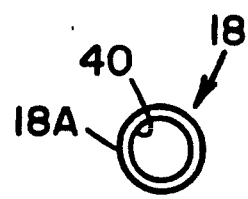
FIG. 7 is an end elevational view of the resonator as seen along line 7—7 of FIG. 6.
Figure 8:
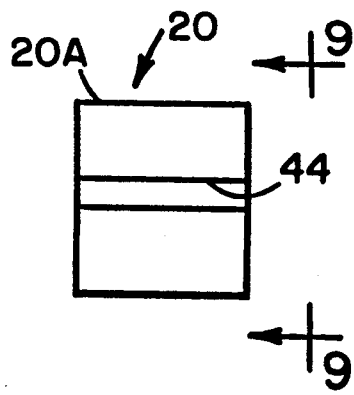
FIG. 8 is an enlarged side elevational view of a resonator support of the probe assembly of FIGS. 1 and 2.
Figure 9:
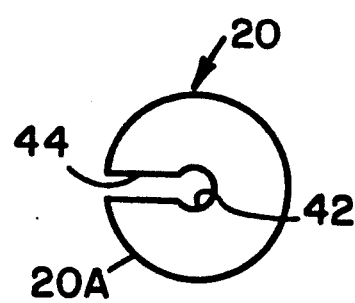
FIG. 9 is an end elevational view of the resonator support as seen along line 9—9 of FIG. 8.

Referring to FIGS. 1, 2 and 5, the outer tube 16 of probe assembly 10 is composed of a suitable electrically conductive metal, such as brass. The outer tube 16 has a pair of opposite open ends 16A, 16B and an internal bore 38 extending therethrough between the opposite ends. The bore 38 has a first section 38A opening at the one end 16A of the outer tube 16 and a second section 38B opening at the other end 16B of the outer tube. As best seen in FIG. 5, the second bore section 38B is of smaller diameter than the first bore section 38A. As seen in FIG. 2, the stem portion 32 of the adapter member 14 inserts into the first bore section 3SA of the outer tube 16 from the one opposite end 16A thereof. A lock nut 39 fastens the stem portion 32 against rotation and loosening up relative to the outer tube end 16A. Concurrently, the end portion 22A of the outer conductor 22 of the coaxial cable 12, that extends from the adapter member 14, inserts into the second bore section 38B of the outer tube 16 and makes electrical contact therewith such that the outer tube 16 now constitutes an electrically conductive extension of the outer conductor 22 of the coaxial cable 12.

Referring to FIGS. 1, 2, 6 and 7, the resonant rod 18 of the probe assembly 10 is composed of a suitable electrically conductive metal, such as copper, and has a pair of opposite end portions 18A, 18B. A recess 40 is formed in the one end portion 18A of the resonant rod 18, adapting it to receive, frictionally fit, and electrically couple with the end portion 24A of center conductor 24 of the coaxial cable 12. The other end portion 18B of the resonant rod 18 has a generally flat transverse end face 18C thereon. The end portions 18A, 18B of the rod 18 are interconnected by a middle portion 18D having a reduced diameter compared to the diameters of the end portions of the rod 18.

Referring to FIGS. 1, 2, 8 and 9, the annular support sleeve 20 of the probe assembly 10 is composed of a suitable non-conductive material, such as the cross-linked copolymer product sold under the trademark REXOLITE of the Atlantic Laminate Co. of Franklyn, N.H. The sleeve 20 has a central opening 42 extending axially through it and a side slot 44 which is coextensive with the opening 42 and extends radially outward from it to the exterior cylindrical surface 20A of the sleeve 20. The sleeve 20 can be inserted over the middle portion 18D of the resonant rod 18 from the side thereof for supporting the rod 18 in the second bore section 38B of the outer tube 16. In such manner, the resonant rod 18 constitutes an electrically conductive extension of the center conductor 24 of the coaxial cable 12.

The resonant rod 18 and the outer tube 16 together define an open end 46 of the extended coaxial cable 12. The left end portion 18B of the rod 18 is capable of acting as a resonant structure upon energizing the coaxial cable 12 which produces fringing fields that protrude from the open end 46. The protruding fringing fields will penetrate a flat test sample A (FIG. 10) disposed adjacent thereto. The sleeve 20 supports the rod 18 in the second bore section 38B such that the end face 18C thereon is substantially aligned radially with the end of the outer tube 16.

As mentioned previously, the material of the test sample A being measured influences the depth of penetration of the fringing fields. In order to observe the effects of the dielectric material, the open end 46 of the coaxial cable 12 must be completely covered by the material of interest. If air is the medium covering part of the probe surface and the test material is covering the other part, the resulting measurement will not be correct for the test material.

Figure 10:
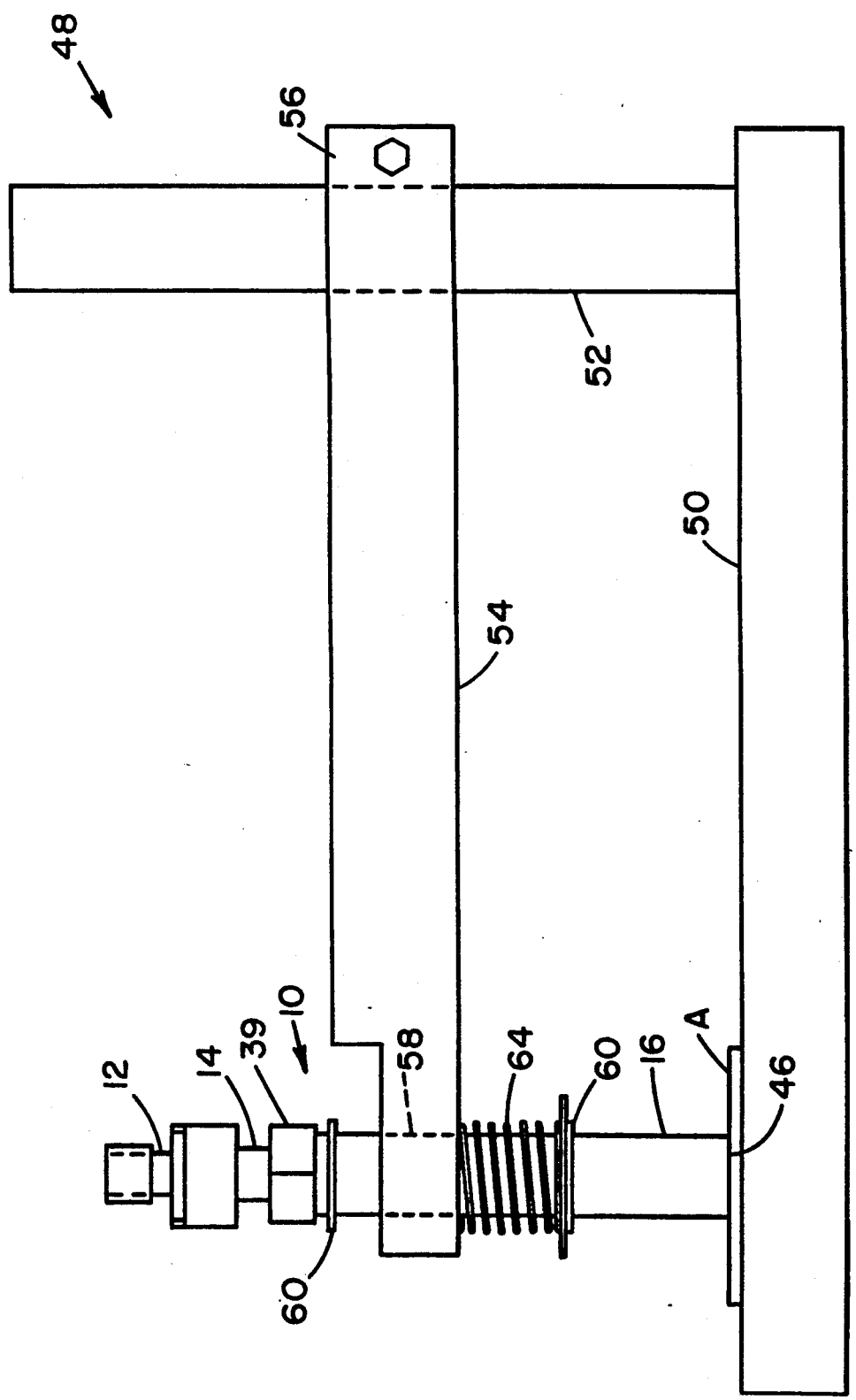
FIG. 10 is a side elevational view of an apparatus for holding the probe assembly and test material to be measured by the method of the present invention.

As a check for accurate measurements, the probe assembly 10 must be maintained perpendicular to the face of the material along the axis of the center conductor 24. To keep the probe assembly 10 perpendicular to the test sample A, as shown in FIG. 10 an apparatus 48 is provided for holding the probe assembly 10 and the test sample A of dielectric material to be measured. The apparatus 48 includes a base 50 for supporting the flat test sample A of material and an upright member 52 is attached to the base 50. An arm 54 has a clamp structure 56 formed at one end for attaching the arm 54 to the upright member 52. The arm 54 extends outward therefrom in cantilevered fashion and generally parallel to the base 52 so as to overlie the base 50. The measurement probe assembly 10 is mounted to an outer end of the arm 54 in generally perpendicular relation to the base 50 and the test sample A thereon. In particular, the probe assembly 10 extends through a small hole 58 through the outer end of the arm 54 so as to be movable vertically toward and away from the base 50. A pair of snap rings 60 are fitted in annular recesses 62 (FIGS. 2 and 5) in the outer tube 16. A coil spring 64 encircles the outer tube 16 between the underside of the arm 54 and the lower snap ring 60 for biasing the probe assembly 10 toward the base 50 such that the open end 46 of the extended coaxial cable 12 of the probe assembly 10 engages and is covered completely by the test sample A on the base 50.

Thus, in the apparatus 48 of FIG. 10, the flat test sample A of dielectric material is supported in a generally horizontal orientation on the base 50. The probe assembly 10 is supported by the arm 54 in a generally perpendicular relation to the test sample A such that the open end 46 of the extended coaxial cable 12 defined by the probe assembly 10 is capable of producing fringing fields that protrude from the open end 46 and penetrate the test sample A disposed adjacent thereto while the open end 46 is completely covered by the test sample A. Due to its vertically movable mounting to the arm 54 and the presence of the spring 64, the probe assembly 10 can be easily lifted and lowered to move it toward and away from the test sample A in order to remove and replace one test sample with another.

It is thought that the present invention and many of its attendant advantages will be understood from the foregoing description and it will be apparent that various changes may be made in the form, construction and arrangement of the parts thereof without departing from the spirit and scope of the invention or sacrificing all of its material advantages, the forms hereinbefore described being merely exemplary embodiments thereof.

What is claimed is:

1. A dielectric constant measurement probe assembly, comprising:

a coaxial cable having an outer electrical conductor terminating at an end portion and a center electrical conductor extending within said outer conductor and terminating at an end portion which projects beyond said end portion of said outer conductor;

an adapter member having a central passage receiving said coaxial cable such that said outer conductor of said cable extends through said passage of said adapter member with said end portion of said outer conductor projecting from said adapter member;

an elongated outer tube of electrically conductive material having a bore composed of first and second axially-extending sections, said second bore section being of smaller diameter than said first bore section, said adapter member being inserted in said first bore section with said end portion of said coaxial cable outer conductor inserted into said second bore section and making electrical contact therewith such that said outer tube constitutes an electrically conductive extension of said outer conductor of said coaxial cable;

an electrically conductive rod electrically coupled with said end portion of said center conductor of said coaxial cable; and an annular sleeve of non-conductive material supporting said conductive rod in said second bore section of said outer tube such that said rod constitutes an electrically conductive extension of said center conductor of said coaxial cable, said rod and outer tube together defining an open end of said coaxial cable such that, upon energizing said coaxial cable said rod, being capable of acting as a resonant structure, produces fringing fields that protrude from said open end and penetrate a test sample disposed adjacent thereto.

2. The probe assembly of claim 1 wherein said coaxial cable includes an end mounting flange with a pair of opposite sides, said outer conductor being attached to and extending from one of said opposite sides of said mounting flange, said center conductor extending through and from said one side of said mounting flange.

3. The probe assembly of claim 2 wherein said coaxial cable further includes a connector attached to said mounting flange and said outer and inner conductors and extending from the other of said opposite sides of said flange.

4. The probe assembly of claim 2 wherein said adapter member has a head portion and an elongated stem portion attached to and extending from said head portion, said central passage extending through said head and stem portions and receiving said coaxial cable such that said flange portion of said cable engages said head portion of said adapter member for attachment therewith and said outer conductor of said cable extends through said passage of said adapter member in contact with said stem portion of said adapter member.

5. The probe assembly of claim 4 wherein said stem portion of said adapter member is inserted into said first bore section of said tube.

6. The probe assembly of claim 1 wherein said rod has a pair of opposite end portions and a middle portion of reduced diameter interconnecting said end portions, one of said opposite end portions interfitted and electrically coupled with said end portion of said center conductor of said coaxial cable, said middle portion providing a coupling junction permitting the other of said opposite end portions to be a resonant structure.

7. The probe assembly of claim 6 wherein said sleeve supports said rod about said middle portion thereof in said second bore section.

8. A dielectric constant measurement apparatus, comprising:
- a base for supporting a flat test sample of dielectric material;
- an upright member attached to said base;
- an arm supported in cantilevered fashion by said upright member above said base;
- the measurement probe assembly of claim 1 mounted to an outer end of said arm in generally perpendicular relation to said base and a test sample thereon, said probe assembly defining an open end of a coaxial cable capable of producing fringing fields that protrude from said open end and penetrate the test sample disposed adjacent thereto, said probe assembly mounted for movement vertically toward and away from said base; and
- means coupled between said arm and said probe assembly for biasing said probe assembly toward said base such that an open end of said coaxial cable of said probe assembly is covered completely by the test sample on said base.

9. The apparatus of claim 8 wherein said probe assembly includes:
- said coaxial cable having an outer electrical conductor terminating at an end portion and a center electrical conductor extending within said outer conductor and terminating at an end portion which projects beyond said end portion of said outer conductor;
- an adapter member having a central passage receiving said coaxial cable such that said outer conductor of said cable extends through said passage of said adapter member with said end portion of said outer conductor projecting from said adapter member;
- an elongated outer tube of electrically conductive material having a bore composed of first and second axially-extending sections, said second bore section being of smaller diameter than said first bore section, said adapter member being inserted in said first bore section with said end portion of said coaxial cable outer conductor inserted into said second bore section and making electrical contact therewith such that said outer tube constitutes an electrically conductive extension of said outer conductor of said coaxial cable;
- an electrically conductive rod electrically coupled with said end portion of said center conductor of said coaxial cable; and
- an annular sleeve of non-conductive material supporting said conductive rod in said second bore section of said outer tube such that said rod constitutes an electrically conductive extension of said center conductor of said coaxial cable, said rod and outer tube together defining said open end of said coaxial cable such that, upon energizing said coaxial cable, said rod being capable of acting as a resonant structure, produces fringing fields that protrude from said open end and penetrate a test sample disposed adjacent thereto.

10. The apparatus of claim 9 wherein said coaxial cable includes an end mounting flange with a pair of opposite sides, said outer conductor being attached to and extending from one of said opposite sides of said mounting flange, said center conductor extending through and from said one side of said mounting flange.

11. The apparatus of claim 10 wherein said coaxial cable further includes a connector attached to said mounting flange and said outer and inner conductors and extending from the other of said opposite sides of said flange.

12. The apparatus of claim 11 wherein said adapter member has a head portion and an elongated stem portion attached to and extending from said head portion, said central passage extending through said head and stem portions and receiving said coaxial cable such that said flange portion of said cable engages said head portion of said adapter member for attachment therewith and said outer conductor of said cable extends through said passage of said adapter member in contact with said stem portion of said adapter member.

13. The apparatus of claim 12 wherein said stem portion of said adapter member is inserted into said first bore section of said tube.

14. The apparatus of claim 9 wherein said rod has a pair of opposite end portions and a middle portion of reduced diameter interconnecting said end portions, one of said opposite end portions interfitted and electrically coupled with said end portion of said center conductor of said coaxial cable.

15. The apparatus of claim 14 wherein said sleeve supports said rod about said middle portion thereof in said second bore section.

16. A dielectric constant measurement method, comprising the steps of:
- supporting a flat test sample of dielectric material; and
- supporting the measurement probe assembly of claim 1 in a generally perpendicular relation to the test sample such that an open end of a coaxial cable defined by the probe assembly is capable of producing fringing fields that protrude from the open end and penetrate the test sample disposed adjacent thereto while the open end is completely covered by the test sample.

17. The method of claim 16 further comprising:
moving the probe assembly toward and away from the test sample in order to remove and replace one test sample with another.

18. A dielectric constant measurement probe assembly, comprising:
a coaxial cable having an end mounting flange with a pair of opposite sides, an outer electrical conductor attached to and extending from one of said opposite sides of said mounting flange and terminating at an end portion, a center electrical conductor extending through and from said one side of said mounting flange within and spaced from said outer conductor to an end portion which projects beyond said end portion of said outer conductor, and a connector attached to said mounting flange and said outer and inner conductors and extending from the other of said opposite sides of said flange;
an adapter member having a head portion, an elongated stem portion attached to and extending from said head portion, and
a central passage extending through said head and stem portions and receiving said coaxial cable such that said flange portion of said cable engages said head portion of said adapter member for attachment therewith and said outer conductor of said cable extends through said passage of said adapter member in contact with said stem portion of said adapter member;
an elongated outer tube of electrically conductive material having a pair of opposite open ends and a bore extending therethrough between said opposite ends, said bore having a first section opening at one of said opposite ends and a second section opening at the other of said opposite ends, said second bore section being of smaller diameter than said first bore section, said stem portion of said adapter member being inserted into said first bore section of said tube from said one opposite end thereof with said end portion of said outer conductor of said coaxial cable that extends from said adapter member being inserted into said second bore section of said outer tube and making electrical contact therewith such that said outer tube constitutes an electrically conductive extension of said outer conductor of said coaxial cable;
an electrically conductive rod having a pair of opposite end portions and a middle portion of reduced diameter interconnecting said end portions, one of said opposite end portions interfitted and electrically coupled with said end portion of said center conductor of said coaxial cable; and
an annular sleeve of electrically non-conductive material disposed in said second bore section of said tube and spaced from said end portion of said outer conductor of said coaxial cable, said annular sleeve supporting said conductive rod about said middle portion thereof in said second bore section such that said rod constitutes an electrically conductive extension of said center conductor of said coaxial cable, said rod and outer tube together defining an open end of said coaxial cable such that, upon energizing said coaxial cable, said rod, being capable of acting as a resonant structure, produces a fringing fields that protrude from said open end and penetrate a test sample disposed adjacent thereto.

* * * * *